US006220914B1

(12) United States Patent
Lee et al.

(10) Patent No.: US 6,220,914 B1
(45) Date of Patent: *Apr. 24, 2001

(54) METHOD OF FORMING GATED PHOTOCATHODE FOR CONTROLLED SINGLE AND MULTIPLE ELECTRON BEAM EMISSION

(75) Inventors: Kim Y. Lee, Fremont; Tai-Hon Philip Chang, Foster City; Marian Mankos, San Francisco, all of CA (US); C. Neil Berglund, Oregon City, OR (US)

(73) Assignee: Etec Systems, Inc., Hayward, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/449,201

(22) Filed: Nov. 24, 1999

Related U.S. Application Data

(62) Division of application No. 09/052,903, filed on Mar. 31, 1998.

(51) Int. Cl.⁷ ........................................................ H01J 9/02
(52) U.S. Cl. .............................................. 445/24; 445/50
(58) Field of Search .................................. 445/24, 47, 49, 445/50

(56) References Cited

U.S. PATENT DOCUMENTS 3,852,133 * 12/1974 Houston .................................... 156/3
4,150,315 * 4/1979 Yang ..................................... 313/101

(List continued on next page.)

FOREIGN PATENT DOCUMENTS

06241747A1   3/1995 (EP) ................................. H01J/1/34

OTHER PUBLICATIONS

Chang, T.H.P. et al., "Electron Beam Technology –SEM To Microcolumn", *Microelectronic Engineering*, Vol. 32, (1996), pp. 113–130.

Chang, T.H.P. et al., "Electron–Beam Sources And Charged–Particle Optics", *SPIE –The International Society for Optical Engineering*, Vol. 2522, Jul. 10–14, 1995, San Diego, California.

Kim. H.S., "Miniature Schottky Electron Source", *J. Vac. Sci. Technol. B 13(6)*, Nov/Dec 1995, pp. 2468–2472.

Kratschmer, E. et al., "Experimental Evaluation Of A 20 x 20 MM Footprint Column", *J. Vac. Sci. Technol. B 14(6)*, Nov/Dec 1996, pp. 3972–2796.

Chang, T.H.P., et al., "Electron Beam Microcolumns For Lithography And Related Applications", *J. Vac. Sci. Technol. B 14(6)*, Nov/Dec 1996, pp. 3774–3781.

Thomson, M.G.R., et al., "Lens And Deflector Design For Microcolumns", *J. Vac. Sci. Technol. B 13(6)*, Nov/Dec 1995, pp. 2445–1449.

*Primary Examiner*—Kenneth J. Ramsey
(74) *Attorney, Agent, or Firm*—Skjerven Morrill MacPhearson, LLP; Sughrue, Mion, Zinn, Macpeak & Seas; Frank Bernstein

(57) ABSTRACT

A photocathode having a gate electrode so that modulation of the resulting electron beam is accomplished independently of the laser beam. The photocathode includes a transparent substrate, a photoemitter, and an electrically separate gate electrode surrounding an emission region of the photoemitter. The electron beam emission from the emission region is modulated by voltages supplied to the gate electrode. In addition, the gate electrode may have multiple segments that are capable of shaping the electron beam in response to voltages supplied individually to each of the multiple segments.

18 Claims, 13 Drawing Sheets

U.S. PATENT DOCUMENTS

| | | | |
|---|---|---|---|
| 4,366,413 | * | 12/1982 | Washida et al. .................... 313/377 |
| 4,460,831 | * | 7/1984 | Oettinger et al. .................... 313/542 |
| 4,467,189 | * | 8/1984 | Tsuchiya ............................. 313/529 |
| 4,546,534 | * | 10/1985 | Nicholas ............................... 29/571 |
| 4,778,738 | * | 10/1988 | Lipp et al. ........................... 313/470 |
| 4,861,730 | * | 8/1989 | Hsia et al. ........................... 438/265 |
| 4,906,894 | * | 3/1990 | Miyawaki et al. .................. 313/542 |
| 4,956,548 | * | 9/1990 | Alfano et al. ........................ 313/529 |
| 5,047,821 | * | 9/1991 | Costello et al. ....................... 357/30 |
| 5,122,663 | | 6/1992 | Chang et al. ........................ 250/310 |
| 5,155,412 | | 10/1992 | Chang et al. .......................... 315/14 |
| 5,156,936 | * | 10/1992 | Beghin ................................. 313/542 |
| 5,171,996 | * | 12/1992 | Perez-Mendez .................... 156/633 |
| 5,395,738 | | 3/1995 | Brandes et al. ...................... 430/296 |
| 5,424,549 | | 6/1995 | Feldman .......................... 250/492.22 |
| 5,426,686 | | 6/1995 | Rentzepis et al. ..................... 378/34 |
| 5,466,924 | | 11/1995 | Van Aller ...................... 250/214 VT |
| 5,489,817 | * | 2/1996 | Muller et al. ........................ 313/495 |
| 5,684,360 | | 11/1997 | Baum et al. ......................... 313/542 |
| 5,751,109 | | 5/1998 | Payne ................................... 313/542 |

\* cited by examiner

A, C, D : +
B : −

A, D : +
B, C : −

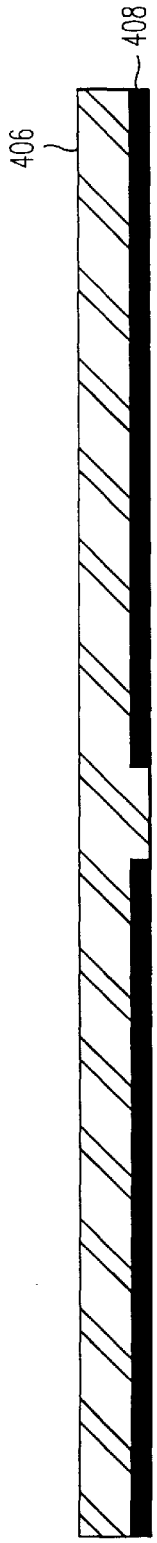
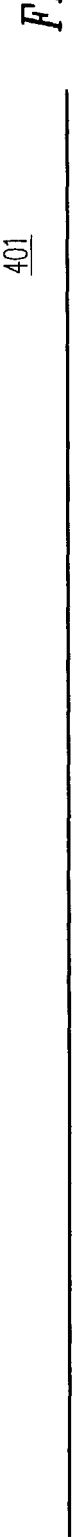
FIG. 7a
FIG. 7b
FIG. 7c

METHOD OF FORMING GATED PHOTOCATHODE FOR CONTROLLED SINGLE AND MULTIPLE ELECTRON BEAM EMISSION

RELATED APPLICATION

This application is a divisional application from U.S. patent application Ser. No. 09/052,903, which was filed on Mar. 31, 1998.

BACKGROUND

1. Field of the Invention

This invention relates to electron beam sources and, more particularly, to photocathodes for the generation of single or multiple electron beams.

2. Prior Art

High resolution electron beam sources are used in systems such as scanning electron microscopes, defect detection instruments, VLSI testing equipment, and electron beam (e-beam) lithography. In general, e-beam systems include an electron beam source and electron optics. The electrons are accelerated from the source and focused to define an image at a target. These systems typically utilize a physically small electron source having a high brightness.

Improvements in optical lithography techniques in recent years have enabled a considerable decrease in the linewidths of circuit elements in integrated circuits. Optical methods, however, will soon reach their resolution limits. Production of smaller line-width circuit elements (i.e., those less than about 0.1 μm) will require new techniques such as X-ray or e-beam lithography.

In e-beam lithography, a controllable source of electrons is desired. A photocathode used to produce an array of patterned e-beams is shown in FIG. 1. U.S. Pat. No. 5,684,360 to Baum et al., "Electron Sources Utilizing Negative Electron Affinity Photocathodes with Ultra-Small Emission Areas," herein incorporated by reference in its entirety, describes a patterned photocathode system of this type.

FIG. 1 shows a photocathode array 100 with three photocathodes 110 comprising a transparent substrate 101 and a photoemission layer 102. The photocathode is back-illuminated with light beams 103 which are focused on photoemission layer 102 at irradiation region 105. As a result of the back-illumination onto photoemission layer 102, electron beams 104 are generated at an emission region 108 opposite each irradiation region 105. Other systems have been designed where the photoemitter is front-illuminated, i.e. the light beam is incident on the same side of the photoemitter from which the electron beam is emitted.

Often, light beams 103 or electron beams 104 are masked. In FIG. 1, light beams 103 are masked using mask 106 which allows light onto irradiation spots 108 but prevents light from being incident on other areas of photoemission layer 102. FIG. 1 also shows mask 107 which allows electrons to exit photoemission layer 102 only at certain surface spots corresponding to emission regions 105. A photocathode may also have a mask between transparent substrate 101 and photoemission layer 102 to block light beam 103 so that it is only incident at irradiation spots 105. In general, photocathode 110 may include no masking layers or may have one or more masking layers.

Each irradiation region 105 may be a single circular spot representing a pixel of a larger shape, the larger shape being formed by the conglomerate of a large number of photocathodes 110 in photocathode array 100. In that case, irradiation region 105 may be as small as is possible given the wavelength of the light beam incident on photocathode 100. Typically, a grouping of pixel irradiation regions has dimensions of 100–200 μm. Each pixel can have dimensions (i.e. diameter) as low as 0.1 μm. Alternatively, irradiation spot 105 and emission region 108 can be a larger shape. In either case, the image formed by emission region 108 will be transferred to e-beam 104 so long as the entirety of irradiation region 105 is illuminated by light beam 103.

Photoemission layer 102 is made from any material that emits electrons when irradiated with light. These materials include metallic films (gold, aluminum, etc.) and, in the case of negative affinity (NEA) photocathodes, semiconductor materials (especially III-V compounds such as gallium arsenide). Photoemission layers in negative electron affinity photocathodes are discussed in Baum (U.S. Pat. No. 5,684,360).

When irradiated with photons having energy greater than the work function of the material, photoemission layer 102 emits electrons. Typically, photoemission layer 102 is grounded so that electrons are replenished. Photoemission layer 102 may also be shaped at emission region 108 in order to provide better irradiation control of the beam of electrons emitted from emission region 108. Further control of the e-beam is provided in an evacuated column as shown in FIG. 2.

Light beams 103 usually originate at a laser but may also originate at a lamp such as a UV lamp. The laser or lamp output is typically split into several beams in order to illuminate each of focal points 105. A set of parallel light beams 103 can be created using a single laser and a beam splitter. The parallel light beams may also originate at a single UV source. Alternatively, the entire photoemission array 100 may be illuminated if the light source has sufficient intensity.

Photons in light beam 103 have an energy of at least the work function of photoemission layer 102. The intensity of light beam 103 relates to the number of electrons generated at focal point 105 and is therefore related to the number of electrons emitted from emission region 108. Photoemission layer 102 is thin enough and the energy of the photons in light beam 103 is great enough that a significant number of electrons generated at irradiation region 103 migrate and are ultimately emitted from emission layer 108.

Transparent substrate 101 is transparent to the light beam and structurally sound enough to support the photocathode device within an electron beam column which may be a conventional column or a microcolumn. Transparent substrate 101 may also be shaped at the surface where light beams 103 are incident in order to provide focusing lenses for light beams 103. Typically, transparent substrate 101 is a glass although other substrate materials such as sapphire or fused silica are also used.

If mask 106 is present either on the surface of transparent substrate 101 or deposited between transparent substrate 101 and photoemission layer 102, it is opaque to light beam 103. If mask 107 is present, it absorbs electrons thereby preventing their release from emission region 108. Mask 107 may further provide an electrical ground for photoemission layer 102 provided that mask 107 is conducting.

Photocathode 100 may be incorporated within a conventional electron beam column or a microcolumn. Information relating to the workings of a microcolumn, in general, is given in the following articles and patents: "Experimental Evaluation of a 20×20 mm Footprint Microcolumn," by E. Kratschmer et al., Journal of Vacuum Science Technology Bulletin 14(6), pp. 3792–96, November/December 1996; "Electron Beam Technology—SEM to Microcolumn", by T. H. P. Chang et al., Microelectronic Engineering 32, pp. 113–130, 1996; "Electron Beam Microcolumn Technology And Applications", by T. H. P. Chang et al., *Electron-Beam Sources and Charged-Particle Optics*, SPIE Vol. 2522, pp. 4–12, 1995; "Lens and Deflector Design for Microcolumns", by M. G. R. Thomson and T. H. P. Chang, Journal of Vacuum Science Technology Bulletin 13(6), pp. 2445–49, November/December 1995; "Miniature Schottky Electron Source", by H. S. Kim et al., Journal of Vacuum Science Technology Bulletin 13(6), pp. 2468–72, November/December 1995; U.S. Pat. No. 5,122,663 to Chang et al.; and U.S. Pat. No. 5,155,412 to Chang et al., all of which are incorporated herein by reference.

FIG. 2 shows a typical electron beam column 200 using photocathode array 100 as an electron source. Column 200 is enclosed within an evacuated column chamber (not shown). Photocathode array 100 may be completely closed within the evacuated column chamber or transparent substrate 101 may form a window to the vacuum chamber through which light beams 103 gain access from outside the vacuum chamber. Electron beams 104 are emitted from emission region 108 into the evacuated column chamber and carry an image of emission region 108. Electron beam 104 may be further shaped by other components of column 200.

Electron beams 104 are accelerated between photocathode array 100 and anode 201 by a voltage supplied between anode 201 and photoemission layer 102. The voltage between photocathode array 100 and anode 201, created by power supply 208 (housed outside of the vacuum chamber), is typically a few kilovolts to a few tens of kilovolts. The electron beam then passes through electron lens 204 that focuses the electron beam onto limiting aperture 202. Limiting aperture 202 blocks those components of the electron beams that have a larger emission solid angle than desired. Electron lens 205 refocuses the electron beam. Electronic lenses 204 and 205 focus and demagnify the image carried by the electron beam onto target 207. Deflector 203 causes the electron beam to laterally shift, allowing control over the location of the image carried by the electron beam on a target 207.

In 0.1 $\mu$m lithography systems, the size of a circular pixel incident on target 207 is on the order of 0.05 $\mu$m. Therefore, the image of emission area 108 needs to be reduced by roughly a factor of 2 to 10, depending on the size of emission region 108. Target 207 may be a semiconductor wafer or a mask blank.

Conventional variable shaped electron beam lithography columns shape the electron beam by deflecting the electron beam across one or more shaping apertures. The resulting image in the shaped electron beam is then transferred to target 207 with a large total linear column demagnification. The requirement of large total linear demagnification (supplied by electron lenses 204 and 205) results in large column lengths, increasing electron-electron interactions that ultimately limit the electron current density of the column. The low electron current density results in a low throughput when the column is used in lithography.

Another major drawback in using known e-beam systems include the inability to modulate the electron beam without modulating the light source itself, usually a laser. Modulating a laser typically involves a large amount of control circuitry, requiring a large amount of space, and can be slow. In addition, in a patterned array of photocathodes, modulation of individual photocathodes in the array is extremely difficult. Finally, better resolution is required of lithography systems in order to meet future demands of semiconductor materials processing.

SUMMARY

According to the present invention, a photocathode has a gate electrode that modulates and, in some embodiments, shapes the emission of an electron beam.

A photocathode emits electrons upon irradiation by a photon beam if the photon energy is greater than the work function of the photocathode. By masking the photocathode selectively with an opaque material, the emission is confined to pre-defined regions. Providing an electrically isolated gate structure that encompasses an emission region of the photocathode allows the intensity of the electron beam to be modulated by application of a gate bias voltage to the gate structure. If the gate structure has multiple segments, the electron beam emitted from the photocathode can also be shaped.

In a photocathode according to the present invention, an emission area is surrounded by a gate electrode that is offset from an electron emitting surface by an insulator. The gate electrode can be electrically controlled in order to turn the electron beam on or off or to vary the intensity of the electron beam. The electron beam is modulated in the region between the gate electrode and electron emitting surface rather than at a light beam source such as a laser, resulting in faster switching times and space savings in the electron beam system.

Embodiments of this invention can be utilized to form an array of photoemission sources each having a precisely controlled emitting region and position. In embodiments where the gate structure of each of the photoemission sources in the array includes a single gate electrode, each of the single gate electrodes in the array may be individually controlled or controlled in groups. In embodiments where the gate structure of each of the photoemission sources in the array includes multiple gate electrodes, each of the multiple gate electrodes may be individually controlled or controlled in groups. In yet other embodiments, the array of photoemission sources may include a combination of photoemission sources having a single gate electrode and photoemission sources having multiple gate electrodes where each gate electrode is individually or group controlled.

In general, emission regions can be of any size or shape that are within the limits of microfabrication technology. Some embodiments of the invention include self-biasing circuitry utilizing photoemission as the feed-back for stable emission intensity.

A photocathode includes a transparent substrate and a photoemission layer. The transparent substrate is transparent to a light source. The light source generates an array of light beams which are focused on an array of irradiation regions directly above the emitting areas on the photoemission layer. In one embodiment, the light source is a laser and the array of light beams results from the laser beam being split into multiple light beams using a beam splitter. Alternatively, the light source may be a UV lamp.

In some embodiments, each emitting area on the photoemission layer is a single pixel, a larger shape being formed by the aggregate of all of the pixels. Alternatively, the emitting area itself may represent any shape that is to be transferred to a target.

In some embodiments, masks are formed on top of the substrate in order to form the light beams into the desired images before the light beams are incident on the irradiation region. Other embodiments place a mask on the emitting surface of the photoemission layer. Yet other embodiments place a mask between the photoemission layer and the substrate in order to form the image in the light beam. In some embodiments, a back surface of the substrate, where the light beams are incident and opposite the photoemission layer, is shaped to provide lenses. The lenses help to focus the light beams onto the irradiation region.

According to the present invention, the emitting area is surrounded by an insulator. The emitting area itself is left uncovered by the insulator. In some embodiments, a single conductor is mounted on the insulator to form a gate electrode. In other embodiments, multiple electrically independent conductors are mounted around the emitting area on the surrounding insulator to form a gate electrode having multiple segments. Each segment of the gate electrode is independently controlled in order to turn on and off a corresponding portion of the electron beam that is initiated at the emitting area.

A photocathode according to the present invention is suitable for use in an arrayed electron source for conventional electron beam columns. Other embodiments of the invention are suitable for use as a miniaturized arrayed electron source for electron beam microcolumns. Some embodiments are suitable for use as a single gated source for conventional electron beam columns and microcolumns.

Photocathode arrays having gate electrodes with multiple segments allow variable shaping at the electron source in an electron beam lithography column without using shaping apertures or shaping optics. Use of these embodiments results in shorter column length because of the reduced need for further beam shaping and demagnification. The shorter column length results in less electron-electron interactions and ultimately a higher throughput in systems such as lithography systems because of the higher intensity electron beams.

The invention and its various embodiments are further discussed along with the following figures and the accompanying text.

In the figures, components having the same or similar functions are identically labeled.

DETAILED DESCRIPTION

Figure 1:
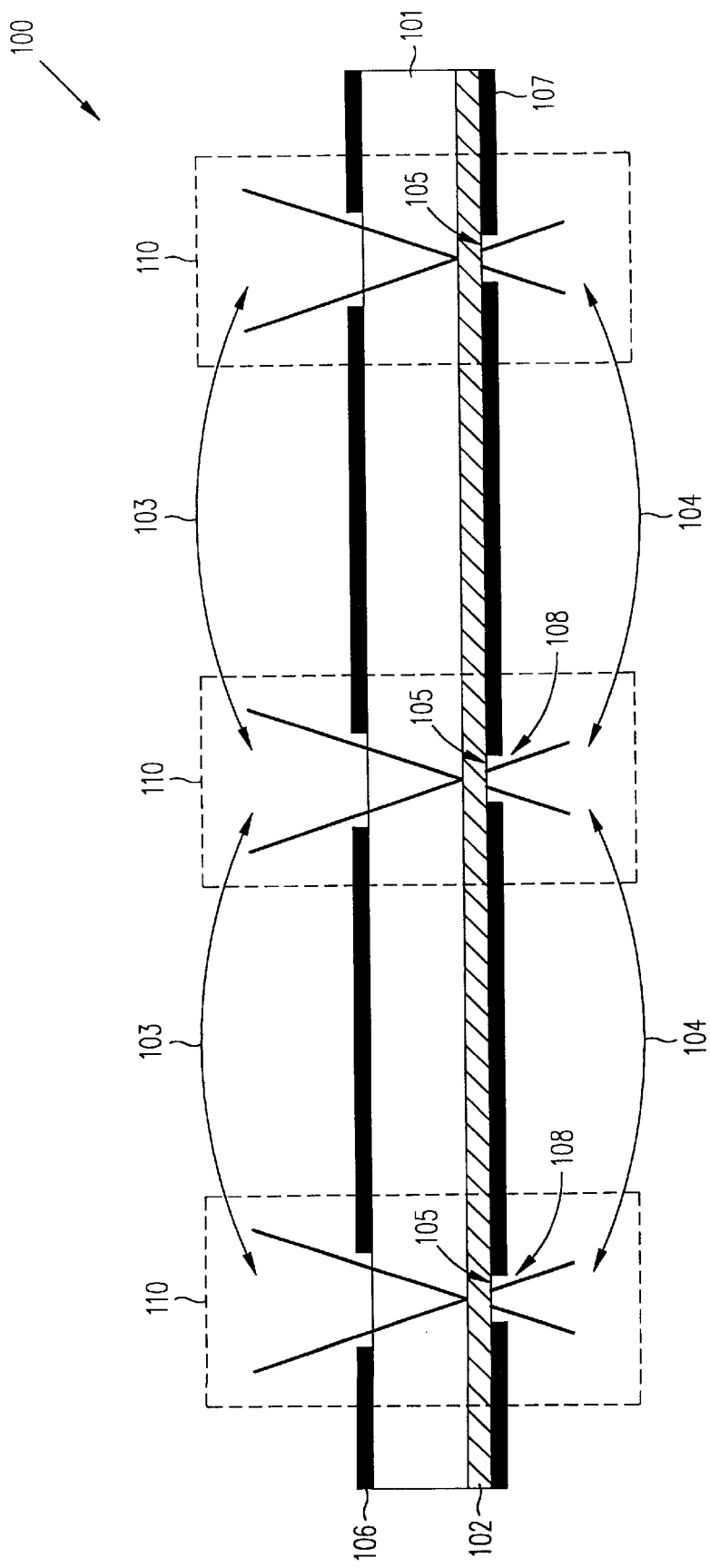
FIG. 1 shows a patterned photocathode according to the prior art.
Figure 2:
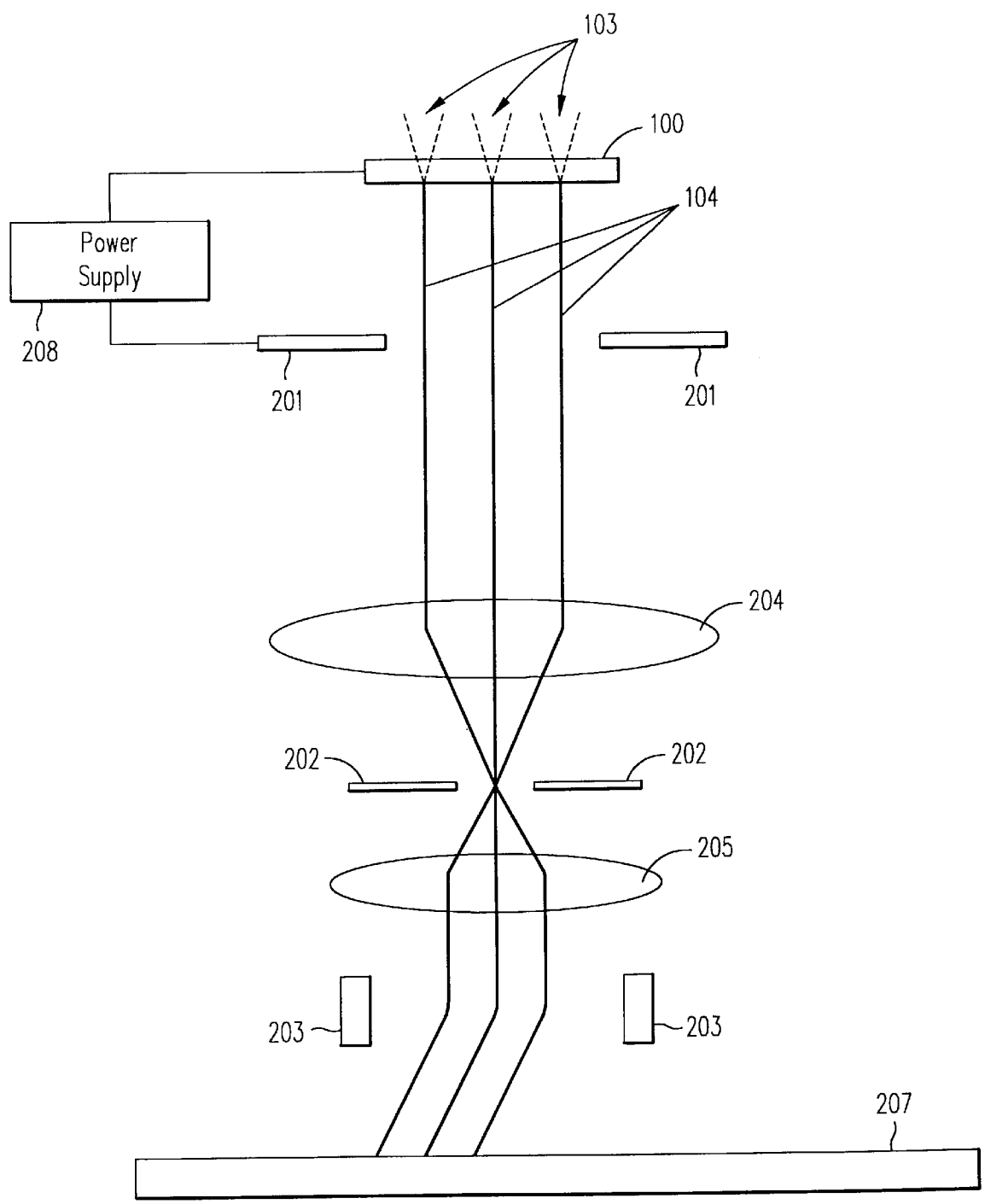
FIG. 2 shows a conventional electron beam column using the photocathode shown in FIG. 1.
Figure 3A:
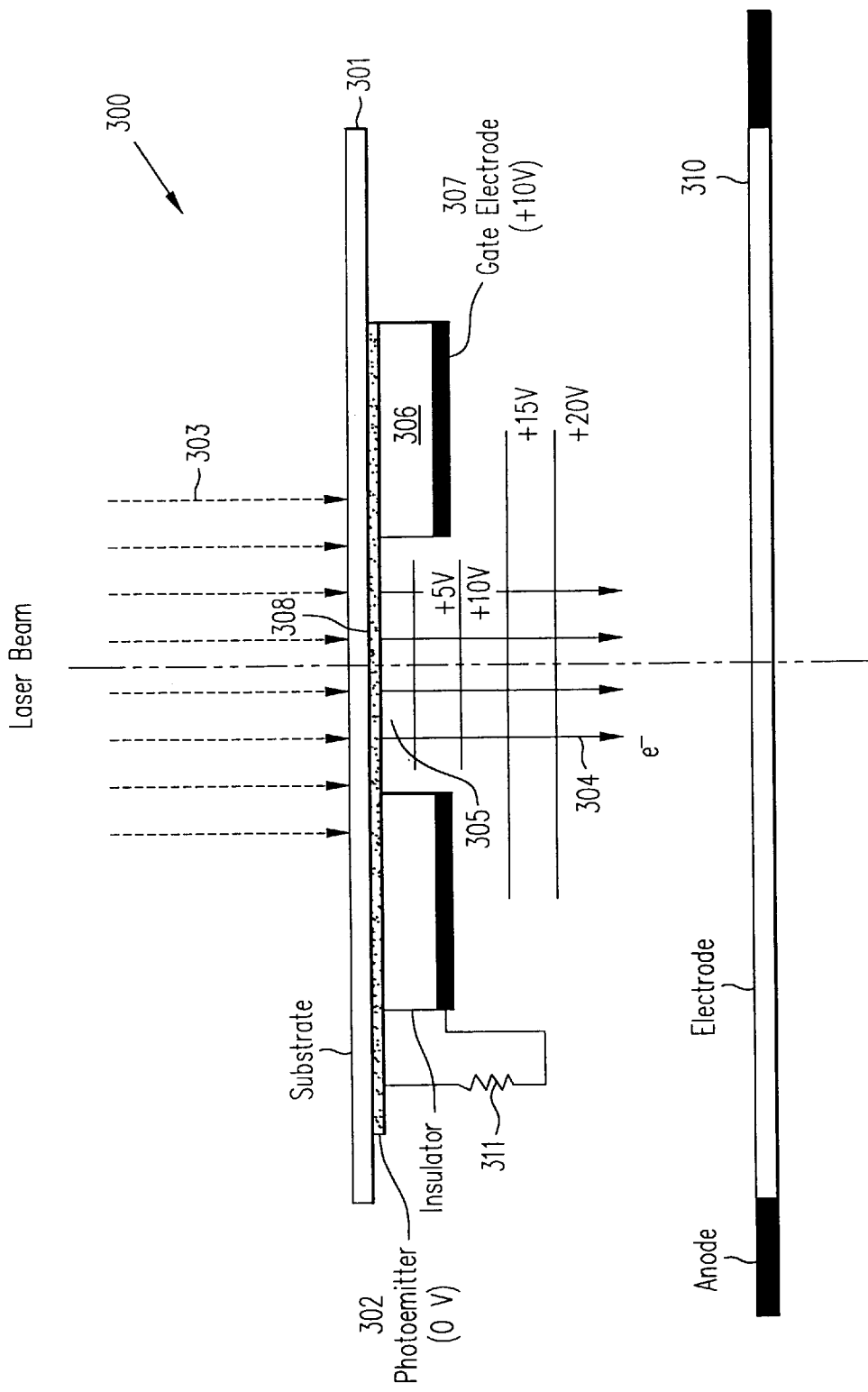
FIGS. 3A and 3B show a photocathode according to the present invention.
Figure 3B:
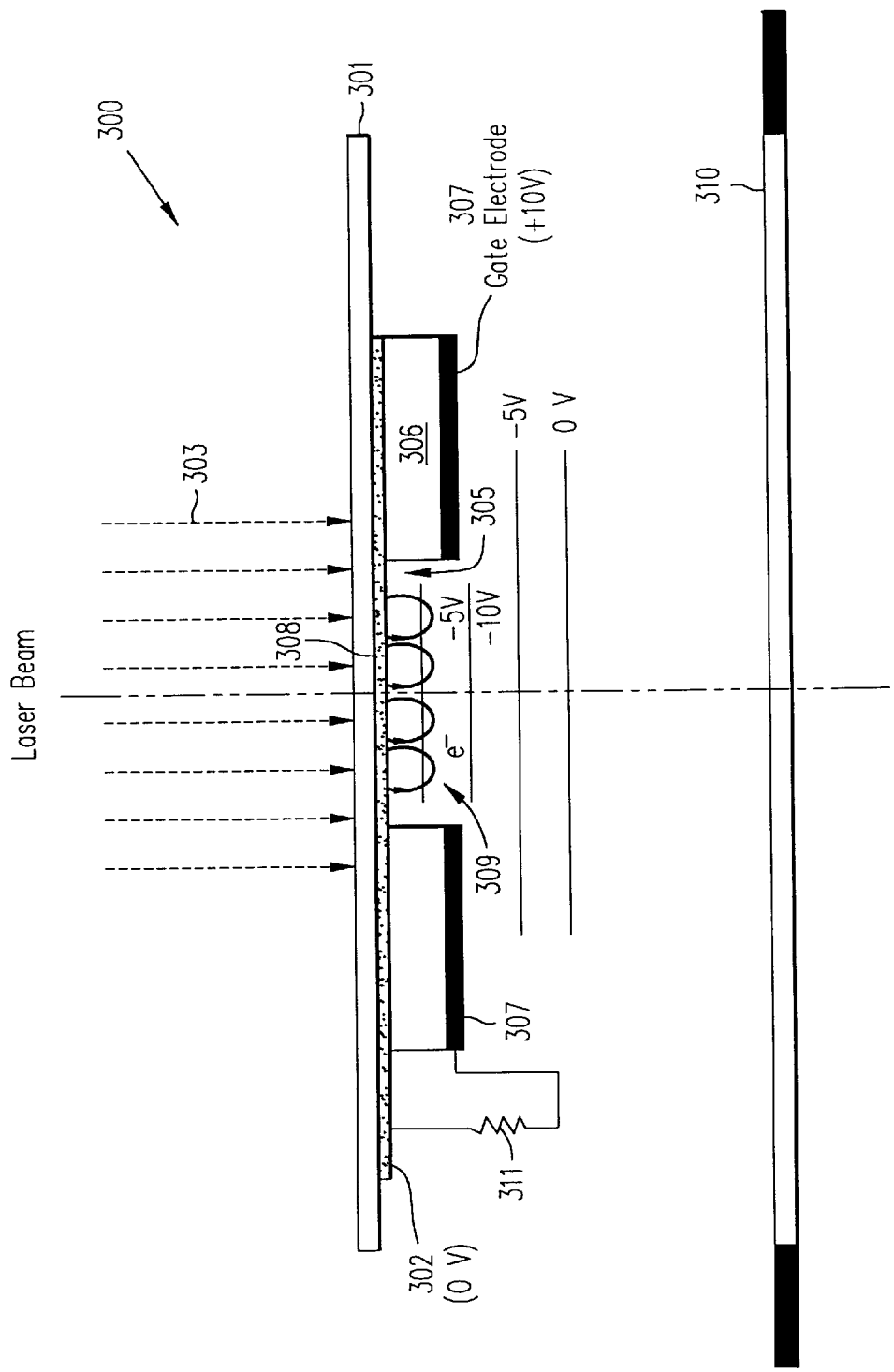

FIGS. 3A and 3B show in a side view an embodiment of a photocathode 300 according to the present invention. (The conventional associated housing, electrical leads, etc. are not shown.) In FIG. 3A, a photoemitter 302 is deposited on a transparent substrate 301. Transparent substrate 301 is usually glass, fused silica or sapphire, although other transparent materials having structural strength sufficient for support can be used.

A light beam 303 is incident on transparent substrate 301, passes through transparent substrate 301, and is absorbed by photoemitter 302 at irradiation region 308. Photoemitter 302 emits electrons from emission area 305, located on the surface of photoemitter 302 opposite of irradiation region 308, when light beam 303 is incident upon irradiation region 308.

Emission area 305 can, in general, be of any shape and any size where gate electrode 307 determines the electric field. Some useful shapes include a circle, a square, a rectangle, an octagon and a hexagon. Irradiation region 308 should at least cover emission area 305.

A gate insulator 306 is deposited on photoemitter 302 such that emission area 305 is surrounded, but not covered, by gate insulator 306. Gate insulator 306 may be made from any electrically insulating material and is preferably made from $SiO_2$. Gate electrode 307 is deposited on the side of gate insulator 306 away from emission region 305. Gate electrode 307 can be made from any conducting material.

Photoemitter 302 can be made from any material that emits electrons when illuminated. The most efficient photoemitting materials include gold, aluminum, and carbide materials. In addition, many III-V semiconductors, such as GaAs, are suitable photoemitter materials. Preferably, photoemitter 302 is made from gold and has a thickness of about 100 Å.

Photoemitter 302 will have a work function that is determined by the actual photoemitter material. The work function is the minimum energy required to release an electron from the material. The photons in light beam 303 must have an energy at least as great as the work function in order that photoemitter 302 will emit electrons.

Light beam 303 is absorbed by photoemitter 302 at, or nearly at, the surface of photoemitter 302 corresponding to irradiation region 308. At that point, electrons will have a kinetic energy equal to the photon energy minus the work function. These electrons migrate from irradiation region 308 to emission area 305 and are emitted from the material at emission area 305 provided that the electrons have not lost too much energy to collisions within the photoemitter material. As such, the thickness of photoemitter 302 should be sufficient to absorb light beam 303 but not so thick as to reabsorb a significant number of the free electrons created.

It is also desirable that, in embodiments of this invention, the kinetic energies of the emitted electrons not be too great, preferably less than 0.5 eV but can be as great as a few eV, so that the emitted electrons can be reflected by a voltage applied to gate electrode 307. If photoemitter 302 is gold, then a light beam having a photon wavelength of 257 nm or less is needed to produce photons having an appropriate photon energy.

Transparent substrate 301 must be transparent to light beam 303 so that the maximum amount of light possible is incident on irradiation region 308. Transparent substrate 301 can be of any thickness but preferably is a few millimeters thick. In addition, light beam 303 may be focused to cover irradiation spot 308 in an area corresponding to emission region 305.

The intensity distribution of light beam 303 is generally gaussian in shape, therefore light beam 303 will be more intense at its center than at its edges. Light beam 303 is preferably focused in such a way that its intensity is nearly uniform across irradiation region 308 so that electron beam 304 has nearly uniform intensity. In general, however, light beam 303 can be as focused as is desired.

Gate electrodes 307 are mounted to insulators 306 and can be constructed from any conducting material. The thickness of gate insulator 306 is preferably about 1000 Å and the thickness of gate electrode 307 is also preferably about 1000 Å. In one embodiment, photoemitter 302 is held at ground voltage and gate electrode 307 is biased at a voltage greater than ground, approximately +10 V, in order to accelerate the electrons that are emitted from photoemitter 302. Gate electrode 307 is biased at voltages less than ground, approximately −10 V, in order to reflect the emitted electrons back towards photoemitter 302. Moreover, stable emission can be achieved by coupling a resistor 311 between photoemitter 302 and gate electrode 307 and using the emission-intensity for feed-back (i.e., a self-biasing system). For example, when electron emission increases the gate voltage decreases correspondingly which in turn lowers the emission intensity.

Anode electrode 310 is held at a voltage of from a few kilovolts to several tens of kilovolts and accelerates the electrons out of photocathode 300 and into an evacuated electron beam column. Alternatively, photoemitter 302 is held at a high negative voltage, gate electrodes 307 are biased at ±10 V compared to photoemitter 302, and anode electrode 310 is grounded.

In FIG. 3A, gate electrode 307 is held at +10 V. This voltage is chosen so as to be consistent with the electric field which would be set up between anode electrode 310 and photoemitter 302 if insulator 306 and gate electrode 307 were absent. With the voltage of gate electrode at 10 V, electron beam 304, which carries the image of emission region 305, is accelerated out of emission region 305. Insulators 306 and gate electrode 307 also act as a mask in order to better shape the image of emission region 305 contained in electron beam 304.

In FIG. 3B, gate electrode 307 is held at −10 V. At this voltage, the electrons emitted by emission region 305 are accelerated back towards emission region 305 by the electric field created between gate electrode 307 and photoemitter 302. No electron beam 304 is created because the electrons emitted from emission region 305 are reflected back into photoemitter 302 rather than being accelerated away from photoemitter 302. Instead of an electron beam, electron cloud 309 is created where electrons are emitted out of photoemitter 302 and promptly accelerated back into photoemitter 302.

In some embodiments of the invention, the voltage at gate electrode 307 is varied in order to control the intensity of the electron beam. The higher the voltage difference between gate electrode 307 and photoemitter 302 the greater the number of electrons that leave photocathode 300. The maximum number of electrons available, those that are emitted from emission region 305 as a result of light beam 303, are extracted when the gate electrodes are set at full on (about 10 V).

Although the examples shown here have the gate biasing voltage at +10 V for full-on operation and −10 V for full-off operation, other parameters for gate voltages are possible. The full-on bias voltage and the voltage applied to anode electrode 310 determines the thickness of insulator 306 because the electric field created by gate electrode 307 at the full-on bias voltage should be consistent with that field which would exist in the absence of gate electrode 307 and gate insulator 306. The full-off bias voltage limits the incident light beam photon energy because in full-off operation the electrons emitted from emission region 308 must be reflected back into photoemitter 302. In addition, gate electrode 307 should be the dominant feature determining the electric fields near emission region 308. The size of emission region 308 is therefore limited by the relative sizes and distances between gate electrodes 306 and anode electrode 310.

In embodiments where switching times are important, the RC time constant of gate electrode 307 should be relatively small. The spacing between gate electrodes, the spacing between the gate electrode and the photoemitter, and the thickness of the electrodes determine the RC time constant and therefore the maximum rate of switching.

Figure 4:
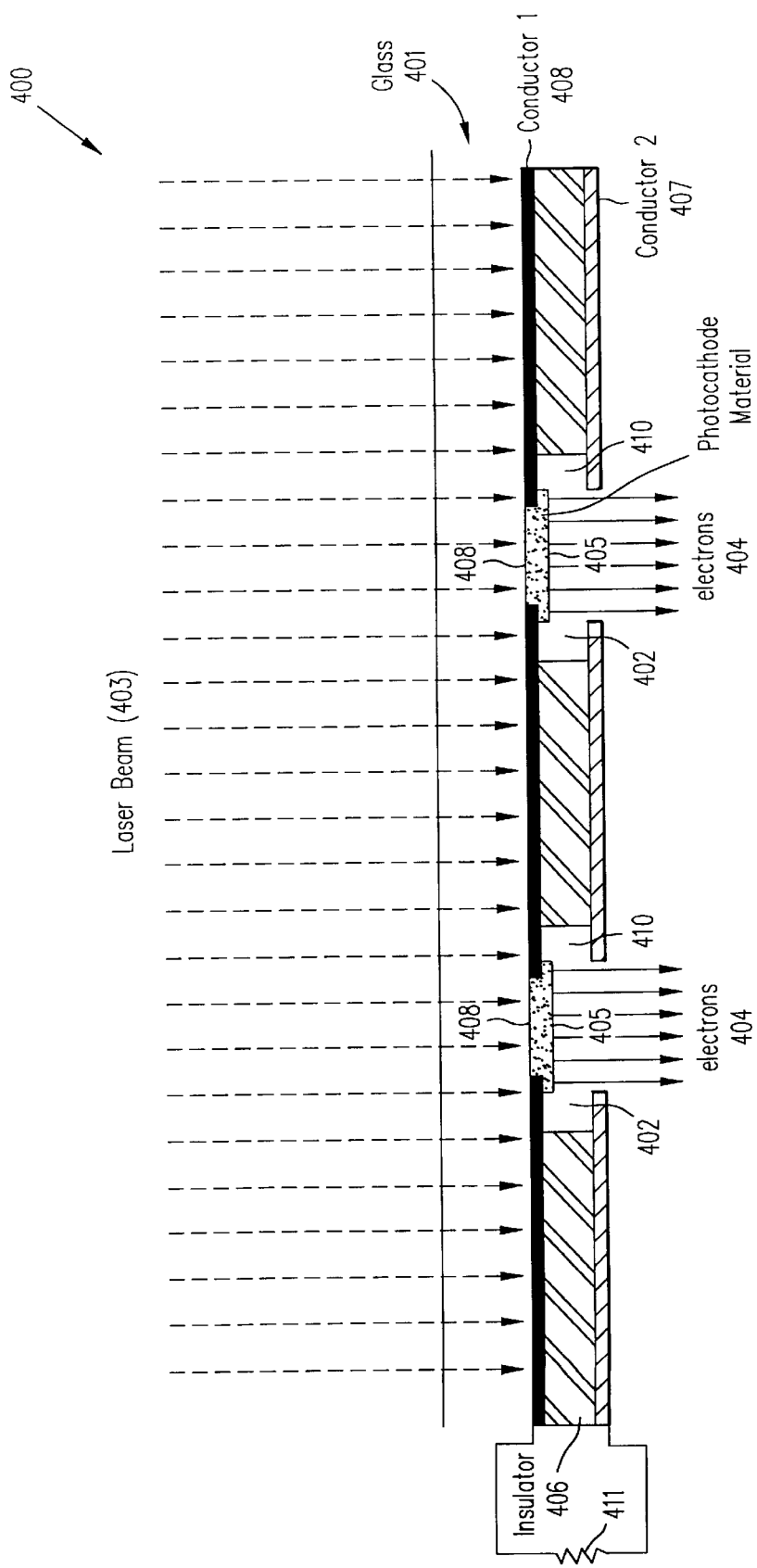
FIG. 4 shows a portion of a photocathode array having two photocathodes according to the present invention.

FIG. 4 shows an embodiment of a photocathode array 400. In FIG. 4, two emission regions 402 of photocathode array 400 are shown and both emission regions 402 are illuminated by light beam 403 which simultaneously illuminates the entire portion of photocathode array 400 shown. Parallel light beams 403 could be used instead with each beam being focused on an individual emission region 402. Photocathode array 400 comprises a transparent substrate 401, a conductor 408, gate insulator 406, gate electrodes 407, and photoemitters 402.

Conductor 408, which can be made from any conducting material but is preferably aluminum, is deposited on transparent substrate 401 and has an opening within which photoemitter 402 is mounted. Photoemitter 402 may be any material which emits electrons when illuminated with photons, as was previously discussed. Again, photoemitter 402 has a work function and the photons in light beam 403 must have an energy at least as great as the work function in order that electrons are emitted from emission region 405. Transparent substrate 401 is preferably glass but can be any material that is transparent to light beam 403 such as sapphire or fused silica. Conductor 408 is opaque to light beam 403 and does not emit electrons from its front when illuminated from the back by light beam 403. Conductor 408, therefore, acts as a mask and defines an irradiation region 408. Emission region 405 lies directly opposite irradiation region 408 on photoemitter 402 and can be of any shape and any size where gate electrodes 407 dominate the electric field.

A gate insulator 406 is mounted on conductor 408 and has an opening 410 such that photoemitters 402 are not covered by insulators 406. Gate electrodes 407 are deposited on gate insulator 406. In this embodiment, gate electrodes 407 overhang opening 410 by an amount sufficient to cause the electric fields created at emission area 405 to be not substantially distorted by gate insulator 406. As in FIGS. 3A and 3B, gate electrode 407 has the ability to turn electron beam 404 on and off with a voltage applied to gate electrode 407. The on and off voltage roughly correspond to +10 V and −10

V, respectively. In addition, ultimate electron beam intensity may be regulated by varying the gate electrode voltage. A self-biasing resistor 411 also may be connected between gate electrode 407 and conductor 408 in order to provide feedback for controlling the intensity of electron beam 404 by self-biasing.

In the photocathodes shown in FIGS. 3A, 3B and 4, the intensity of the electron beams may be controlled by controlling the actual voltage between the gate electrode and the photoemitter. The lower the voltage, the less intensity that the electron beam will have because fewer of the electrons will escape the electron cloud where the electrons have a statistical distribution of velocities in the direction of electron beam propagation. In addition, the gate electrodes may be used to regulate the intensity of the resulting electron beam. In some embodiments, a resistor is placed between the gate electrode and the photoemitter so that a self-biasing feedback is created, i.e., if emission increases, the gate voltage lowers correspondingly.

In FIG. 4, gate electrode 407 is shown as being the same for each emission area 405. However, in general each emission area 405 has a gate electrode 407 that is electrically isolated from the other gate electrodes. In addition, a gate electrode for a particular emission area may include several segments each of which are electrically isolated from all of the others.

In some embodiments, the gate electrode surrounding the emission region has multiple segments. Multiple segments allow the ability to turn on parts of the emission region while turning off other parts of the emission region, shaping the image carried by electron beam 404.

Figure 5:
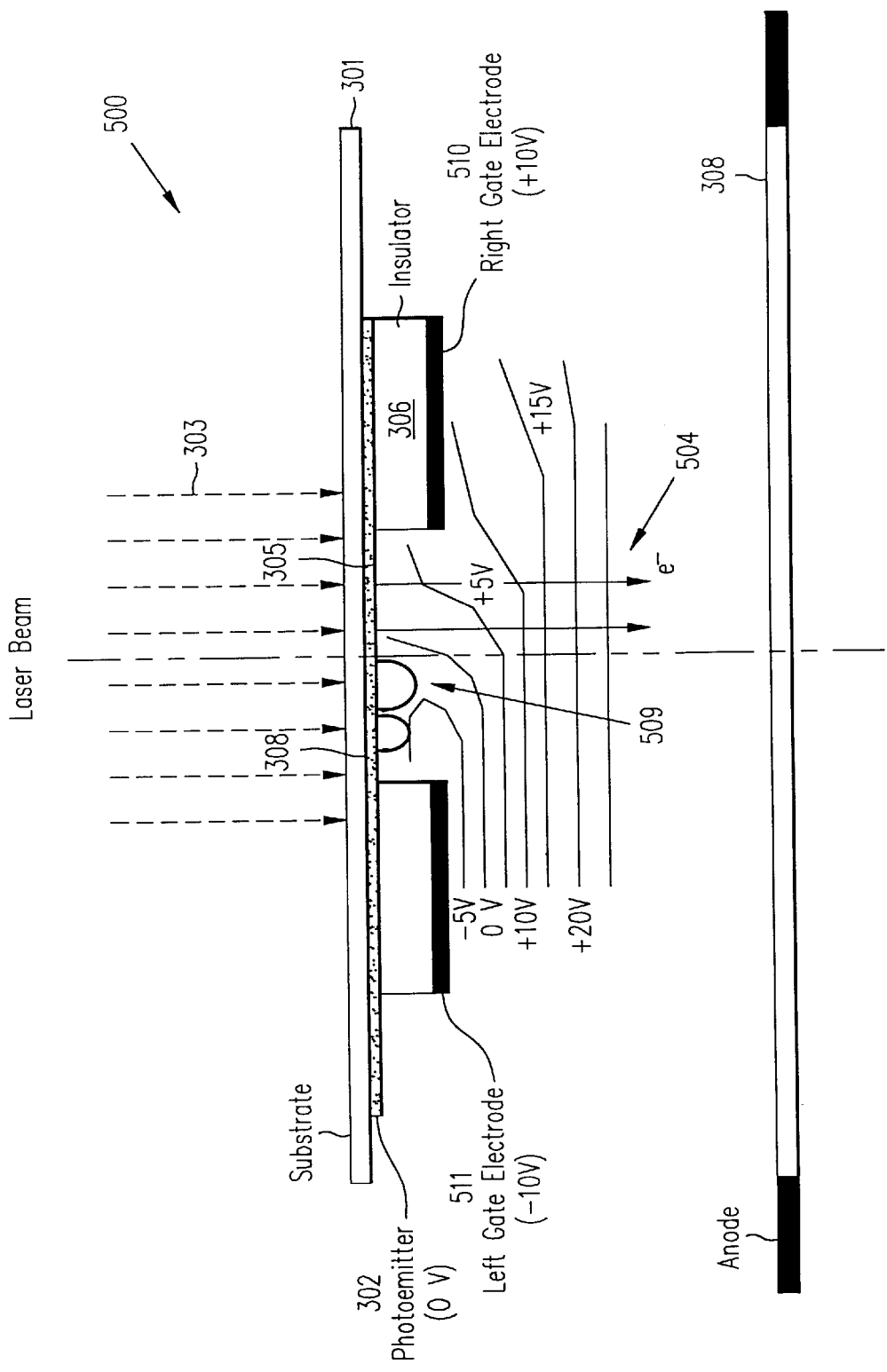
FIG. 5 shows a photocathode according to the present invention having a gate electrode with multiple segments.

FIG. 5 shows a photocathode as in FIG. 3 but with a right gate segment 510 and a left gate segment 511 instead of single segment gate electrode 307. The result of this construction is that the electron beam can be selectively switched on. For example, in FIG. 5 right gate segment 510 is held full-on at a bias voltage of 10 V and left gate segment 511 is held full-off at a bias voltage of −10 V. The resulting electric field reflects electrons which are emitted by emission region 305 near left gate segment 511 while accelerating electrons are emitted out from emission region 305 near to right gate segment 510 of photocathode 500. The resulting electron beam 504 is an image of, in this example, half the emission region 305. The resulting electron beam 504 distribution is not uniform and is most intense near right gate segment 510 and is essentially off at a point midway between the two segments 510 and 511.

Figure 6A:
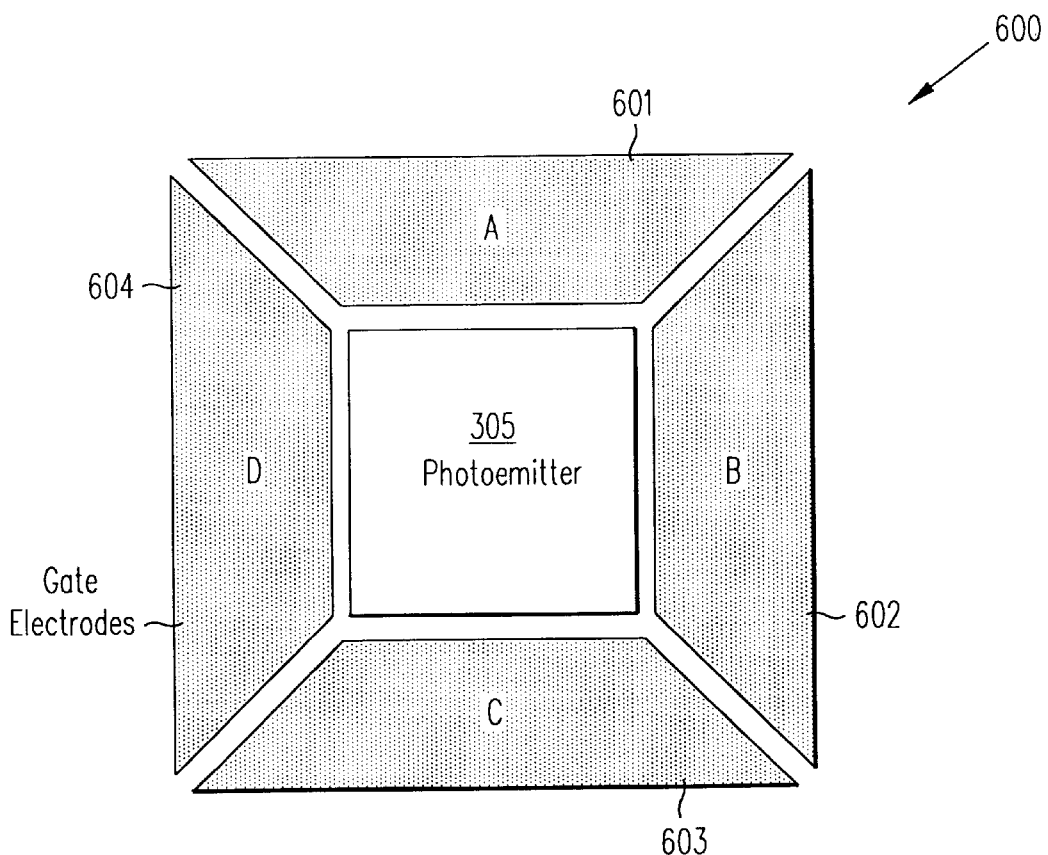
FIG. 6A shows a photocathode according to the present invention having multiple independent segments in the gate electrode.

FIG. 6A shows in a plan view a four segment gate electrode configuration. The gate segments are segment A 601, B 602, C 603, and D 604. Emission region 305 in this example is a square. Emission region 305 can be of any shape but is preferably a square. Other useful shapes include a circle, a rectangle, an octagon and a hexagon.

Figure 6B:
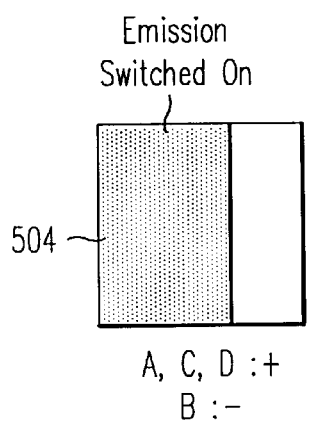
FIGS. 6B and 6C show sample patterned e-beams resulting from selectively turning on the segments shown in the gate electrode of FIG. 6A.
Figure 6C:
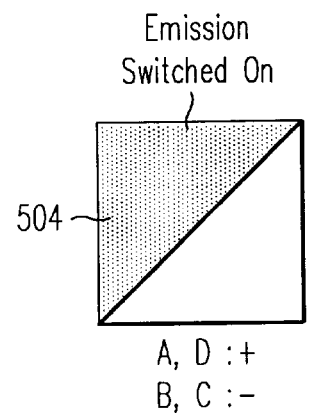
Figure 10:
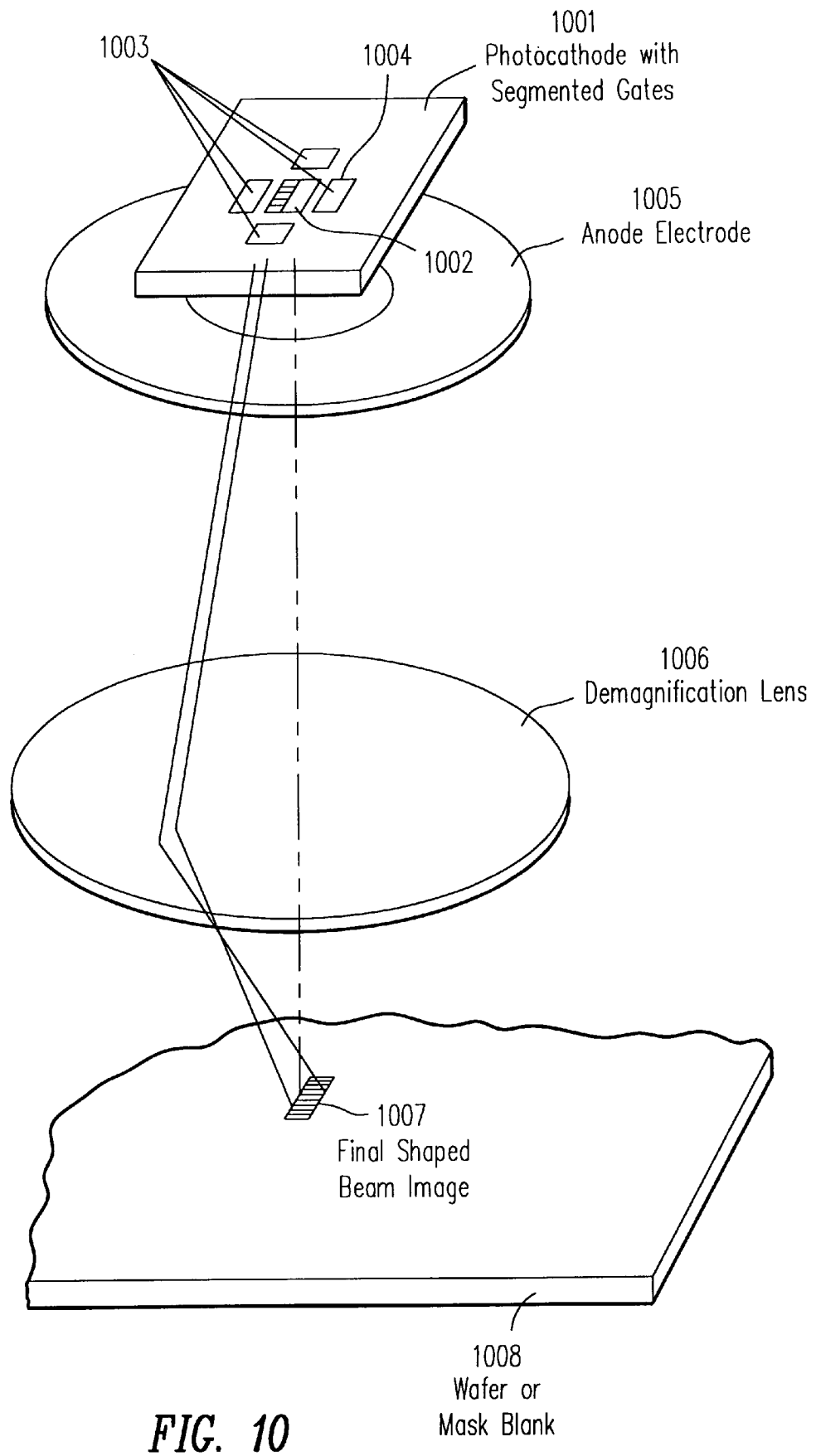
FIG. 10 shows a multiple segment gated photocathode used in an electron beam column where the beam shaping is accomplished at the photocathode.

FIG. 6B shows in a plan view electron beam 504 that results when gate segments A 601, C 603, and D 604 are turned on (i.e., held at +10 V) and gate segment B 602 is turned off (i.e., held at −10 V). FIG. 6C shows in a plan view electron beam 504 that results when gate segments A 601 and D 604 are turned on while gate segments B 602 and C 603 are turned off. Other shaped electron beams can be formed by selectively controlling the voltages of the segments of the gate electrodes. This ability lends great versatility to constructing photocathode arrays that are useable for a variety of different tasks. FIG. 10 shows a photocathode having a segmented gate electrode used in an electron beam column for electron beam lithography.

In general, any number of gate segments can be used. The more gate segments there are, the more control a user of the photocathode has over the electron beam created from a given emission area. This ability may be of great importance in efficiently writing features onto semiconductor substrates. In addition, resistors can be coupled between individual segments of the gate electrode and the photoemitter in order to provide self-biasing control over electron beam intensity as described above.

The photocathodes described above are conducive to miniaturization and precise integration into multiple photocathode sources. A photocathode array can be constructed on a single substrate with precise positioning of photocathodes. In particular, FIGS. 7A–7F illustrate a process of manufacturing the photocathode illustrated in FIG. 4 using conventional semiconductor processing steps. The illustrated process shows only a single photocathode of the photocathode array. However, one skilled in the art can produce a photocathode array having precisely placed photocathodes with various emission area shapes and gate structures from this illustration. In addition, one skilled in the art can modify this process in order to manufacture other photocathodes according to this invention or alter this process in ways that result in the same photocathode construction.

Figure 7D:
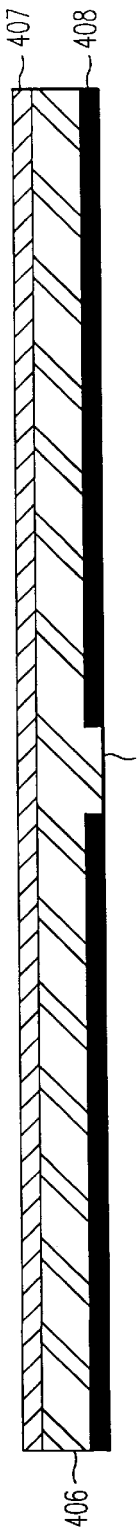
FIG. 7 depicts the process of forming a photocathode according to the embodiment of the invention presented in FIG. 4.

FIG. 7A shows in a cross sectional view the first step in the process where an opaque layer of conducting film is deposited on a transparent substrate 401 such as glass, fused silica, or sapphire. Preferably, transparent substrate 401 is a glass substrate. As shown in FIG. 7B, the conducting film is masked and a window having an appropriate size and shape to form an emission area 410 is etched through the conducting film. A gate insulator 406 is then deposited on top of conducting film 408 and also fills the window of emission area 410. Gate insulator 406 can be any electrical insulator but preferably is $SiO_2$. A gate electrode layer 407 is then deposited on top of gate insulator 406 as shown in FIG. 7D.

Figure 7E:
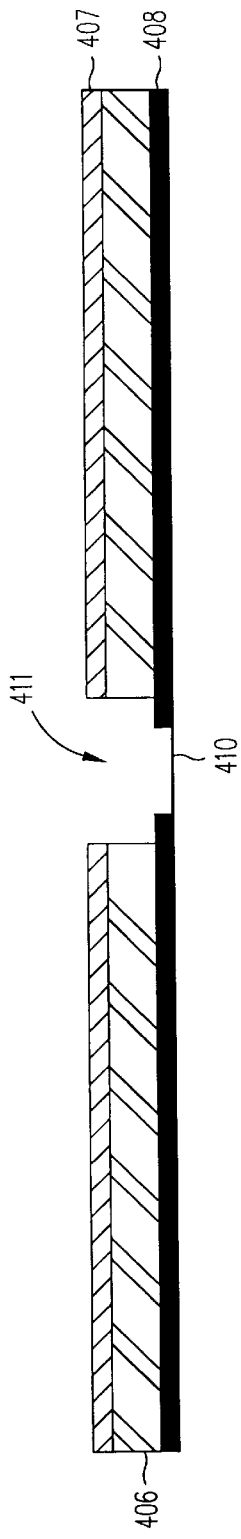

Gate insulator 406 is then masked and a hole 411 is etched through gate electrode layer 407 and insulating film 406 as is shown in FIG. 7E. Hole 411 is aligned with emission area 410 and is slightly larger than emission area 410. In addition, all of insulating film 406 is removed from the window of emission area 410 by this etch.

Figure 7F:
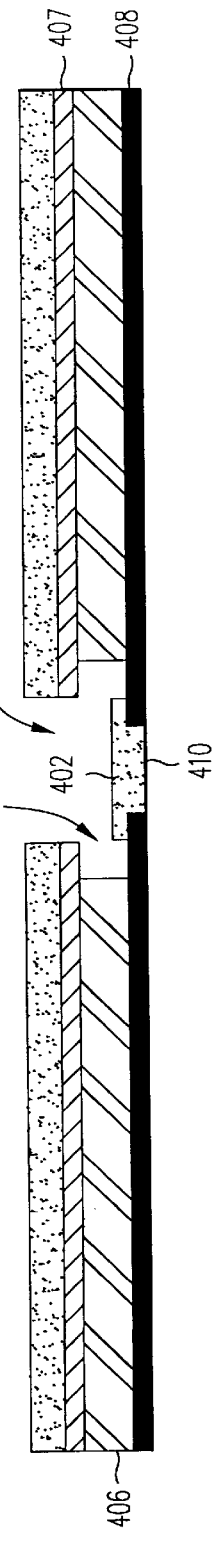

In FIG. 7F, a selective isotropic etch has created a recessed hole 412 in insulating film 406 so that gate electrode 407 now overhangs the opening created at hole 411 and recessed hole 412. Finally, photocathode material 402 is deposited using a directional deposition technique such as thermal evaporation from a point source or ionized sputter deposition. This final deposition forms a photocathode 400 with a self-aligned gate aperture and is formed such that the photocathode is electrically connected to conducting layer 408 but maintains electrical isolation from gate electrodes 407.

In addition, in an array of photocathodes manufactured by this process, each gate electrode segment surrounding each of the photocathodes may be formed by appropriately masking the gate insulator 406 during deposition of gate electrode layer 407. Alternatively, gate electrode layer 407 may be individually etched to form individual gate segments. Also, interconnect lines that connected gate electrode segments to pads can be formed along with the gate electrode segments or may be deposited at a later process step.

As an alternative manufacturing method, the substrate could be coated with conducting layer 408, gate insulator 406 and gate electrode 407 first. Window 411 is then etched through all films down to transparent substrate 401. Using a selective isotropic etch, the opening in gate electrode 407 could be enlarged slightly with respect to the corresponding window 410 in conducting layer 408. Also alternatively, multiple segments of gate electrodes are created around each of holes 411 by isotropically etching insulating breaks in gate electrode 407.

In some embodiments, the surface of substrate 401 may be shaped in order to focus the light beam onto an irradiation region corresponding to emission area 410 of photoemitter 402. Also, in some embodiments, photoemitter 402 may itself be shaped so as to better focus the resulting electron beam that is emitted from the photocathode.

Figure 8:
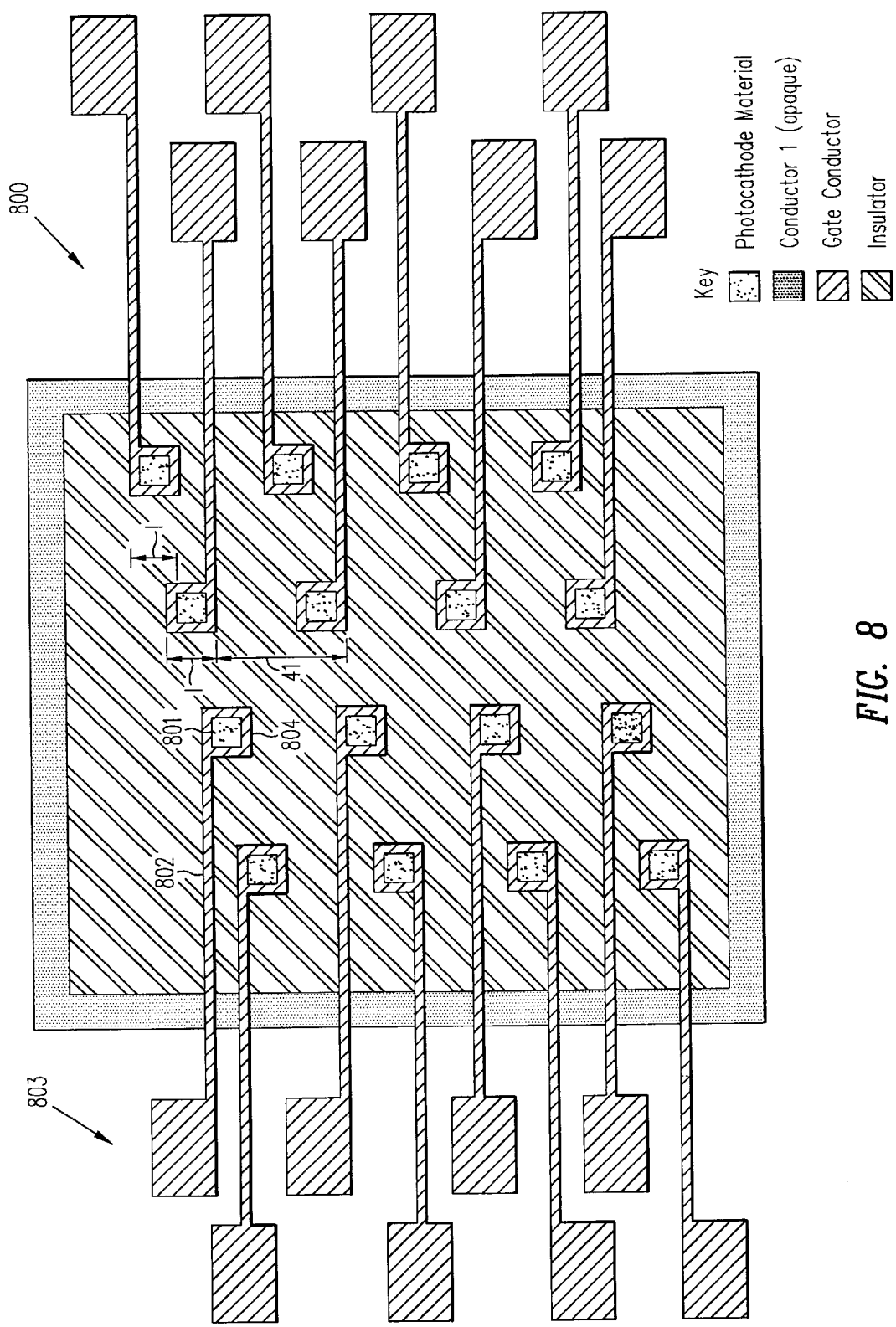
FIG. 8 shows a photocathode array according to the present invention.

FIG. 8 shows in a plan view a four by four array of patterned photocathodes. Emission areas 801 in this example are squares although any shape, including circles, rectangles, hexagons and octagons, can be fabricated. Gate electrode 804 fully surrounds each emission area 801. Although only a single segment gate electrode is shown in FIG. 8, gate electrode 804 may in general be constructed of multiple electrode segments for further control of the electron emission from emission area 801. Gate electrode 804 is connected to a bonding pad 803 by an interconnect line 802. Both bonding pad 803 and interconnect 802 are preferably made from the same material as is gate electrode 804 but any conductor making electrical contact with gate electrode 804 can be used. In general, for lithography systems it is desirable that the physical separation between two adjacent emission regions be such that the array is a square. The minimum separation between emission regions is approximately four times the physical dimensions of the emission region. In FIG. 8, the dimension of the square emission region with current microfabrication technology can be as small as 0.1 $\mu$m. Preferably, the side dimension of the emission region is 0.1 $\mu$m. Therefore, the whole four by four array shown in FIG. 8 is constructable within a square 1.6 $\mu$m on a side, which is well within conventional microfabrication limits.

Figure 9:
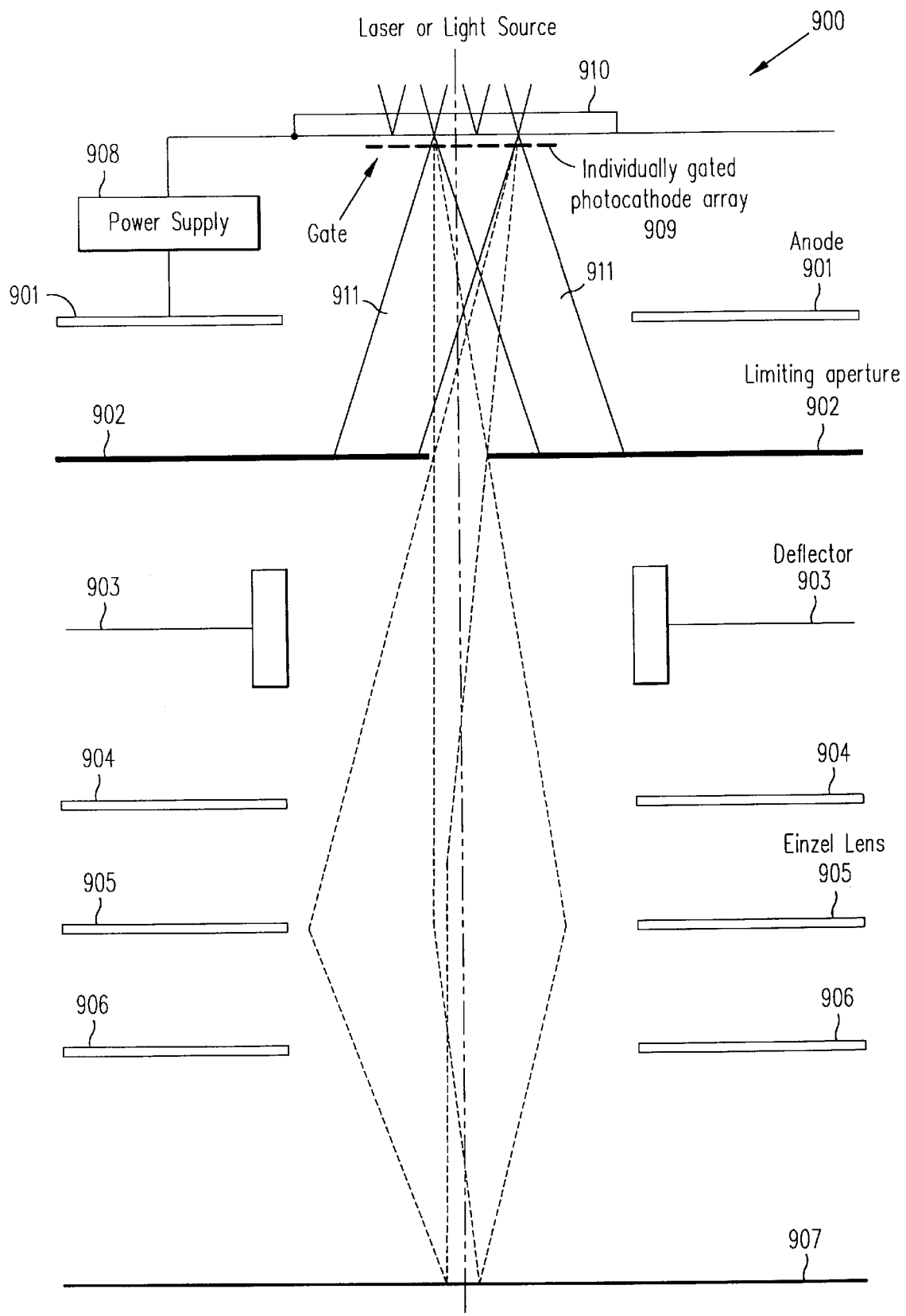
FIG. 9 shows a micro-column utilizing a photocathode according to the present invention.

FIG. 9 shows in a side view a photocathode array 910 according to this invention mounted within a microcolumn 900. Microcolumn 900 is contained within an evacuated chamber (not shown). The substrate of photocathode array 910 may suffice as a vacuum window allowing a laser light source onto the irradiation regions of photocathode array 910 or alternatively photocathode array 910 may be fully enclosed in the vacuum chamber. Electron beams 911 are emitted from the emission regions of photocathode array 910 and, depending on the control inputs to gate electrodes 909 of photocathode array 910, are accelerated through anode 901. Anode 901 is held at a voltage of from one kilovolt to several tens of kilovolts over that of the photoemitters in photocathode 910. Limiting aperture 902 blocks a portion of beams 911 which have a larger emission solid angle than desired. Deflector 903 allows the image of the emission regions contained in electron beams 911 to be laterally shifted. Einzel lens, having electrodes 904, 905, and 906, focuses and demagnifies the image onto target 907. Target 907 may be either a semiconductor wafer or a mask blank for electron beam lithography.

Photocathode array 910 can include any number of individual photocathodes. Each of the individual photocathodes can include a single segment gate or a multiple segment gate. The image formed in electron beam 911 is dependent upon the emission areas of each of the individual photocathodes and the states of the gate electrodes of each of the individual photocathodes. For example, a photocathode array 910 having one photocathode with a single segment gate can only produce an image of the emission area of the photocathode. With a photocathode array 910 having multiple photocathodes, each with an individually controlled single segment gate, various images can be formed by selectively turning on the individually controlled photocathodes to form conglomerates of the images of each of the emission areas of the "on" photocathodes. A photocathode array 910 where some of the photocathodes have multisegmented gate electrodes have the most versatility because images can be formed using portions of emission areas of the individual photocathodes.

FIG. 10 shows an electron source 1001 having a single photocathode 1004. Photocathode 1004 has an emission area 1002 and a four segment gate structure 1003. The four segment gate structure is capable of selectively imaging emission area 1002. In the example of FIG. 10, the four segment gate structure 1003 is used to shape an electron beam image equivalent to one half of emission area 1002. The electron beam carrying the electron beam image is accelerated out of photocathode 1004 by extraction electrode 1005. Demagnification lens 1006 demagnifies the electron beam image onto wafer or mask blank 1008 to form the final shaped beam image. The system shown in FIG. 10, having a minimal number of components, allows shaped electron beam columns to be constructed utilizing a minimum amount of space.

Figure 11:
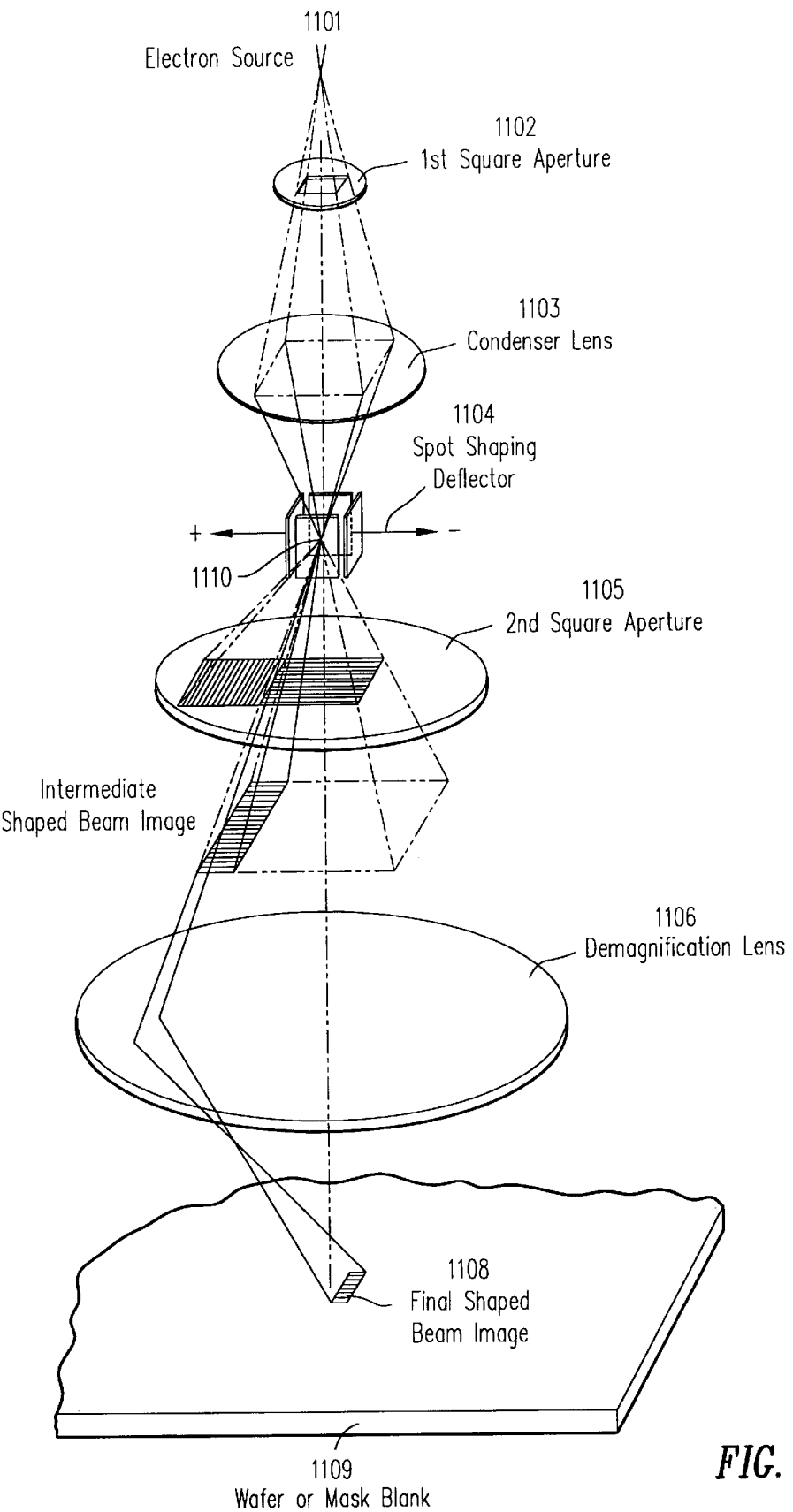
FIG. 11 shows a conventional variable shaped beam electron beam column having multiple shaping components.

FIG. 11 shows a conventional variable shaped electron beam column, in contrast to the electron beam column shown in FIG. 10. An electron beam is formed at electron source 1101. Electron source 1101 may be a thermionic cathode such as lanthanum hexaboride, $LaB_6$, or a single gated photocathode similar to that shown in FIG. 3. The electron beam is shaped by square aperture 1102 to form a shaped electron beam. The shaped electron beam is focused by electron lens 1103 into region 1110. Spot shaping deflector 1104 deflects the electron beam at focus region 1110 so that the shaped electron beam is shifted. The shaped electron beam is then passed through square aperture 1105 to form an intermediate shaped electron beam. Square aperture 1105 passes that portion of the electron beam that overlaps with the aperture and blocks that portion of the electron beam outside the aperture so that only a portion of the image formed by square aperture 1102 is passed into the intermediate shaped beam image. Demagnification lens 1106 demagnifies the image and focuses the image onto a final shaped beam image 1108 on a wafer or mask blank 1109.

The above described examples are demonstrative only. Variations that are obvious to one skilled in the art fall within the scope of this invention. As such, this application is limited only by the following claims.

We claim:

1. A method of fabricating a photocathode, comprising:
   forming a conducting film on a transparent substrate;
   etching a window through the conducting film;
   forming an insulating film on top of the conducting film;
   forming a gate electrode film on top of the insulting film;
   etching an opening through the gate electrode film and the insulating layer, the opening being aligned with the window through the conducting film;
   recessing the opening in the insulating layer;
   forming a photoemission layer into the opening in the gate electrode film so that a photoemitter is inserted into the window through the conducting film.

2. The method of claim 1, wherein recessing the opening in the insulating layer includes isotropically etching the insulating layer.

3. The method of claim 1, wherein forming a photoemission layer includes directionally depositing material using thermal evaporation or ionized sputtering.

4. The method of claim 1, wherein the photoemission layer is selected from one of a group consisting of gold, aluminum, and carbide.

5. The method of claim 1, wherein the transparent substrate is glass, fused silica or sapphire.

6. The method of claim 1, wherein the insulating film is $SiO_2$.

7. The method of claim 1, further including:
shaping the transparent substrate to irradiation incident radiation onto the window.

8. The method of claim 1, further including shaping the photoemitter to further shape electron emission.

9. The method of claim 1, further including selectively etching the gate electrode film in order to form a gate electrode having multiple segments.

10. A method of fabricating a photocathode, comprising:
forming a conducting film on a transparent substrate;
forming an insulating film on the conducting film;
forming a gate electrode film on the insulating film;
etching an opening through the gate electrode film, the insulating film, and the conducting film, the opening in the conducting film forming a window;
recessing the opening in the insulating layer;
forming a photoemission layer into the opening in the gate electrode film so that a photoemitter is inserted into the window through the conducting film.

11. The method of claim 10, wherein recessing the opening in the insulating layer includes isotropically etching the insulating layer.

12. The method of claim 10, wherein forming a photoemission layer includes directionally depositing material using thermal evaporation or ionized sputtering.

13. The method of claim 10, wherein the photoemission layer is selected from a group consisting of gold, aluminum, and carbide.

14. The method of claim 10, wherein the transparent substrate is glass, fused silica or sapphire.

15. The method of claim 10, wherein the insulating film is $SiO_2$.

16. The method of claim 10, further including:
shaping the transparent substrate to irradiation incident radiation onto the window.

17. The method of claim 10, further including shaping the photoemitter to further shape electron emission.

18. The method of claim 10, further including selectively etching the gate electrode film in order to form a gate electrode having multiple segments.

* * * * *

UNITED STATES PATENT AND TRADEMARK OFFICE
CERTIFICATE OF CORRECTION

PATENT NO. : 6,220,914 B1
DATED : April 24, 2001
INVENTOR(S) : Kim Y. Lee et al.

It is certified that error appears in the above-identified patent and that said Letters Patent is hereby corrected as shown below:

<u>Column 1,</u>
Lines 8-10, insert the following:

-- This invention was made with U.S. Government support under Contract No.: N00019-95-C-0059 awarded by the Department of the Navy. The Government has certain rights in this invention. --

Signed and Sealed this

Twenty-eighth Day of January, 2003

JAMES E. ROGAN
*Director of the United States Patent and Trademark Office*